United States Patent
Fujii et al.

(10) Patent No.: US 8,733,905 B2
(45) Date of Patent: May 27, 2014

(54) PIEZOELECTRIC DEVICE, PROCESS FOR PRODUCING THE SAME, AND LIQUID DISCHARGE DEVICE

(75) Inventors: Takamichi Fujii, Kanagawa-ken (JP); Takayuki Naono, Kanagawa-ken (JP); Yoshikazu Hishinuma, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/347,333

(22) Filed: Jan. 10, 2012

(65) Prior Publication Data
US 2012/0102696 A1  May 3, 2012

Related U.S. Application Data

(62) Division of application No. 12/042,999, filed on Mar. 5, 2008, now abandoned.

(30) Foreign Application Priority Data

Mar. 6, 2007 (JP) ................................ 2007-055664

(51) Int. Cl.
*B41J 2/045* (2006.01)

(52) U.S. Cl.
USPC ............................................. 347/68; 310/364

(58) Field of Classification Search
USPC ............................................. 347/68; 310/364
See application file for complete search history.

(56) References Cited

U.S. PATENT DOCUMENTS

| 4,500,397 | A | * | 2/1985 | Mori .............................. 204/487 |
| 5,166,908 | A | * | 11/1992 | Montgomery ................. 367/165 |
| 6,204,525 | B1 | | 3/2001 | Sakurai et al. |
| 6,231,779 | B1 | * | 5/2001 | Chiang et al. ............ 252/62.9 R |
| 2001/0027167 | A1 | * | 10/2001 | Kawakubo et al. ........... 505/475 |
| 2001/0046107 | A1 | | 11/2001 | Irie et al. |
| 2001/0055820 | A1 | | 12/2001 | Sakurai et al. |
| 2002/0018105 | A1 | * | 2/2002 | Usui et al. ........................ 347/70 |
| 2003/0076007 | A1 | | 4/2003 | Murai |
| 2003/0234835 | A1 | | 12/2003 | Torii et al. |

(Continued)

FOREIGN PATENT DOCUMENTS

| EP | 1 376 711 A2 | 1/2004 |
| EP | 1 583 162 A2 | 10/2005 |

(Continued)

OTHER PUBLICATIONS

Yoon, Ki Hyun, et al. "Effects of orientation on the dielectric and piezoelectric properties . . . thin films". Applied Physics Letters, vol. 79. No. 7, Aug. 13, 2001. XP012030027.

(Continued)

*Primary Examiner* — Peter Radkowski
(74) *Attorney, Agent, or Firm* — Birch, Stewart, Kolasch & Birch, LLP.

(57) ABSTRACT

A piezoelectric device includes a substrate; and a laminated film formed above the substrate. The laminated film includes a lower electrode layer, a piezoelectric layer, and an upper electrode layer formed in this order, and the lower electrode layer is a metal electrode layer containing as one or more main components one or more nonnoble metals and/or one or more nonnoble alloys. Preferably, the one or more main components are one or more of the metals Cr, W, Ti, Al, Fe, Mo, In, Sn, Ni, Cu, Co, and Ta, and alloys of the metals.

7 Claims, 5 Drawing Sheets

(56) References Cited

U.S. PATENT DOCUMENTS

| | | |
|---|---|---|
| 2004/0090500 A1 | 5/2004 | Murai |
| 2004/0132221 A1 | 7/2004 | Kobayashi et al. |
| 2005/0069429 A1* | 3/2005 | Sugahara .................. 417/413.2 |
| 2005/0134652 A1* | 6/2005 | Iwashita et al. ................ 347/68 |
| 2005/0189571 A1* | 9/2005 | Karasawa et al. ............. 257/213 |
| 2005/0219328 A1* | 10/2005 | Kodama ......................... 347/70 |
| 2005/0232573 A1* | 10/2005 | Iwauchi et al. ............... 385/147 |
| 2005/0253904 A1* | 11/2005 | Miyazawa et al. ............. 347/68 |
| 2006/0012644 A1 | 1/2006 | Yasui |
| 2006/0012646 A1 | 1/2006 | Yasui |
| 2006/0055743 A1* | 3/2006 | Kodama et al. ................ 347/68 |
| 2006/0131680 A1 | 6/2006 | Akiyama et al. |
| 2006/0187272 A1 | 8/2006 | Torii et al. |
| 2006/0196025 A1* | 9/2006 | Mita .......................... 29/25.35 |
| 2006/0208617 A1 | 9/2006 | Murai |
| 2007/0164634 A1* | 7/2007 | Yao et al. ...................... 310/321 |
| 2007/0237998 A1* | 10/2007 | Armstrong et al. ............. 429/31 |
| 2008/0013761 A1* | 1/2008 | Matsuzawa et al. .......... 381/191 |
| 2008/0075927 A1 | 3/2008 | Sakashita |
| 2008/0081216 A1* | 4/2008 | Fujii et al. ..................... 428/697 |

FOREIGN PATENT DOCUMENTS

| | | | |
|---|---|---|---|
| JP | 58-194206 A | 11/1983 | |
| JP | 62-165381 A | 7/1987 | |
| JP | 83-055198 A | 3/1988 | |
| JP | 10060653 A * | 3/1998 | ............. C23C 16/50 |
| JP | 11-343200 A | 12/1999 | |
| JP | 2000-188377 A | 7/2000 | |
| JP | 2003-174211 A | 6/2003 | |
| JP | 2004-079991 A | 3/2004 | |
| JP | 2004-265900 A | 9/2004 | |
| JP | 2005-209912 A | 8/2005 | |
| JP | 1 616 700 A1 | 1/2006 | |
| JP | 2006-13839 A | 1/2006 | |
| JP | 2006-054442 A | 2/2006 | |
| JP | 2006-278579 A | 10/2006 | |
| JP | 2006-340007 A | 12/2006 | |
| JP | 2006-344618 A | 12/2006 | |

OTHER PUBLICATIONS

Decision of Rejection issued Sep. 24, 2013 in Japan Application No. 2008-038359, along with a partial English translation.

* cited by examiner

PIEZOELECTRIC DEVICE, PROCESS FOR PRODUCING THE SAME, AND LIQUID DISCHARGE DEVICE

This application is a Divisional of application Ser. No. 12/042,999, filed on Mar. 5, 2008 now abandoned, the entire contents of which are hereby incorporated by reference and for which priority is claimed under 35 U.S.C. §120.

BACKGROUND OF THE INVENTION

1. Field of the Invention

The present invention relates to a piezoelectric device, a process for producing the piezoelectric device, and a liquid discharge device using the piezoelectric device.

2. Description of the Related Art

Currently, piezoelectric devices constituted by a piezoelectric layer and upper and lower electrode layers are used, for example, as actuators installed in inkjet recording heads. In the piezoelectric devices, the piezoelectric layer expands and contracts in correspondence with increase and decrease in the strength of an electric field applied from the upper and lower electrode layers to the piezoelectric layer.

The inkjet recording heads have a basic structure in which a piezoelectric device as above and a diaphragm are attached to an ink-nozzle member. The ink-nozzle member has a plurality of ink chambers and a plurality of ink-discharge outlets. The ink chambers reserve ink, and the ink is externally discharged from the ink chambers through the ink-discharge outlets. Normally, the piezoelectric layer is patterned into separate pieces corresponding to the plurality of ink chambers.

The perovskite oxides such as PZT-based oxides are known as materials suitable for the piezoelectric layer, where PZT stands for lead titanate zirconate. The PZT-based piezoelectric layer can be formed, for example, by vapor phase epitaxy such as sputtering. Depending on the composition and the material of the dopant, some types of PZT-based piezoelectric layers formed by vapor phase epitaxy such as sputtering normally have spontaneous polarization oriented upward (i.e., the negatively-polarized side of the PZT-based piezoelectric layer is the lower side, and the positively-polarized side of the PZT-based piezoelectric layer is the upper side) unless special polarization processing is performed immediately after the formation of the PZT-based piezoelectric layers.

As disclosed in Japanese Unexamined Patent Publication No. 2005-209912, noble metals such as iridium (Ir) and platinum (Pt) are widely used in the lower electrode layers of the conventional piezoelectric devices. However, the noble metals such as Ir and platinum Pt are expensive. That is, use of the noble metals is not preferable from the viewpoint of the cost. In addition, the noble metals such as Ir are uneasy to etch. Specifically, the noble metals such as Ir cannot be etched by wet etching, and can be etched by only ion etching among various types of dry etching, so that patterning of the noble metals such as Ir is difficult.

Therefore, conventionally, the lower electrode layer is not patterned, and is formed to have a uniform film structure, and each of the PZT-based piezoelectric layer and the upper electrode layer is patterned into separate pieces corresponding to a plurality of ink chambers. In this case, it is necessary that the lower electrode layer be a grand electrode (to which a fixed voltage is applied), and the upper electrode layer realize address electrodes (to which variable voltages are applied). The drivers for driving the piezoelectric devices are usually positive-output drivers. Thus, conventionally, polarization-inversion processing is performed in order to make the spontaneous polarization oriented downward (i.e., so that the negatively-polarized side of the piezoelectric layer becomes the upper side, and the positively-polarized side of the piezoelectric layer becomes the lower side) before the upper electrode layer is driven by positive-output drivers.

However, in the case where a PZT-based piezoelectric layer has upward spontaneous polarization after formation of the PZT-based piezoelectric layer unless special polarization processing is performed, it is inefficient to perform polarization-inversion processing of the PZT-based piezoelectric layer, and the polarization-inversion processing may not be able to realize sufficient piezoelectric performance which the PZT-based piezoelectric layer can intrinsically exhibit. In view of the above circumstances, the present inventors consider that if the lower electrode layer can be patterned into address electrodes and the address electrodes can be driven by positive-output drivers, the polarization-inversion processing of the PZT-based piezoelectric layer can be dispensed with, and it is possible to achieve the sufficient piezoelectric performance which the PZT-based piezoelectric layer can intrinsically exhibit.

SUMMARY OF THE INVENTION

The present invention has been made in view of the above circumstances.

The first object of the present invention is to provide a piezoelectric device having a lower electrode layer which exhibits satisfactory etching performance and can be patterned at low cost.

The second object of the present invention is to provide a process for producing the above piezoelectric device.

The third object of the present invention is to provide a liquid discharge device using the above piezoelectric device.

(I) In order to accomplish the above first object, a piezoelectric device according to the first aspect of the present invention is provided. The piezoelectric device according to the first aspect of the present invention comprises a substrate; and a laminated film formed above the substrate. The laminated film includes a lower electrode layer, a piezoelectric layer formed on the lower electrode layer, and an upper electrode layer formed on the piezoelectric layer, and the lower electrode layer is a metal electrode layer containing as one or more main components one or more nonnoble metals and/or one or more nonnoble alloys.

In this specification, the term "nonnoble metals" means the metals other than noble metals.

Preferably, the piezoelectric device according to the first aspect of the present invention may further have one or any possible combination of the following additional features (i) to (ix).

(i) The lower electrode layer contains as one or more main components one or more of metals Cr, W, Ti, Al, Fe, Mo, In, Sn, Ni, Cu, Co, and Ta, and alloys of the metals.

In this specification, the term "main component" means a component the content of which is 50% or higher by weight.

(ii) The lower electrode layer contains as one or more main components one or more of iron (Fe) and alloys of iron.

(iii) The lower electrode layer is formed by vapor phase epitaxy.

(iv) The lower electrode layer is patterned by use of wet etching.

(v) The piezoelectric layer is formed of a perovskite oxide, and is (100) oriented, although the piezoelectric layer may contain inevitable impurities.

(vi) The piezoelectric layer has spontaneous polarization, the negatively-polarized side of the spontaneous polarization is oriented toward the lower electrode layer, the positively-polarized side of the spontaneous polarization is oriented toward the upper electrode layer, the upper electrode layer realizes a grand electrode to which a fixed voltage is applied, the lower electrode layer is separated into address electrodes, and variable voltages are applied to the address electrodes.

(vii) In the piezoelectric device having the feature (vi), the piezoelectric device may further comprise a driver which drives the address electrodes so as to vary the voltages applied to the address electrodes.

(viii) In the piezoelectric device having the feature (vi), the piezoelectric layer is formed at 400° C. to 600° C.

(ix) In the piezoelectric device having the feature (vi), the piezoelectric layer is formed by vapor phase epitaxy using plasma under a condition that the difference between a floating potential Vf and a plasma potential Vs in plasma generated during formation of the piezoelectric layer is 10 to 35 V.

Japanese Unexamined Patent Publication No. 62(1987)-165381 discloses a piezoelectric device using plates of stainless steel as electrodes. In the piezoelectric device, bulk electrodes (realized by the plates of stainless steel) and bulk piezoelectric bodies are alternately piled. That is, none of the electrodes and the piezoelectric bodies in the disclosed piezoelectric device are films as the upper and lower electrode layers and the piezoelectric layer in the piezoelectric device according to the first aspect of the present invention. Further, the electrodes and the piezoelectric bodies in the disclosed piezoelectric device are not patterned.

(II) In order to accomplish the above second object, a process according to the second aspect of the present invention is provided. The process according to the second aspect of the present invention is a process for producing the piezoelectric device according to the first aspect of the present invention. The process comprises the steps of: (a) forming a first film for the lower electrode layer; (b) patterning the first film; (c) forming a second film for the piezoelectric layer; and (d) patterning the second film.

Preferably, the process according to the second aspect of the present invention may further have one or any possible combination of the following additional features (x) and (xi).

(x) The step (b) and the step (d) are concurrently performed after the step (a) and the step (c) are performed.

(xi) The step (b) and the step (d) are performed by use of wet etching.

(III) In order to accomplish the above third object, a liquid discharge device according to the third aspect of the present invention is provided. The liquid discharge device according to the third aspect of the present invention comprises: the piezoelectric device according to the first aspect of the present invention; and a discharge member being formed integrally with or separately from the substrate in the piezoelectric device, and including, a liquid-reserve chamber which reserves liquid, and a liquid-discharge outlet through which the liquid is externally discharged from the liquid-reserve chamber.

(IV) The present invention has the following advantages.

In the piezoelectric device according to the first aspect of the present invention, the lower electrode layer is a metal electrode layer containing as one or more main components one or more nonnoble metals and/or one or more nonnoble alloys. Therefore, the etching performance of the lower electrode layer is satisfactory, so that the lower electrode layer can be patterned into address electrodes at low cost by using an inexpensive technique such as wet etching. Thus, it is unnecessary to perform the polarization-inversion processing even in the case where the negatively-polarized side of the spontaneous polarization is oriented toward the lower electrode layer. Consequently, according to the present invention, it is possible to produce, at low cost, a piezoelectric device which exhibits satisfactory piezoelectric performance.

DESCRIPTION OF PREFERRED EMBODIMENTS

Preferred embodiments of the present invention are explained in detail below with reference to drawings.

1. PIEZOELECTRIC DEVICE AND INKJET RECORDING HEAD

Figure 1:
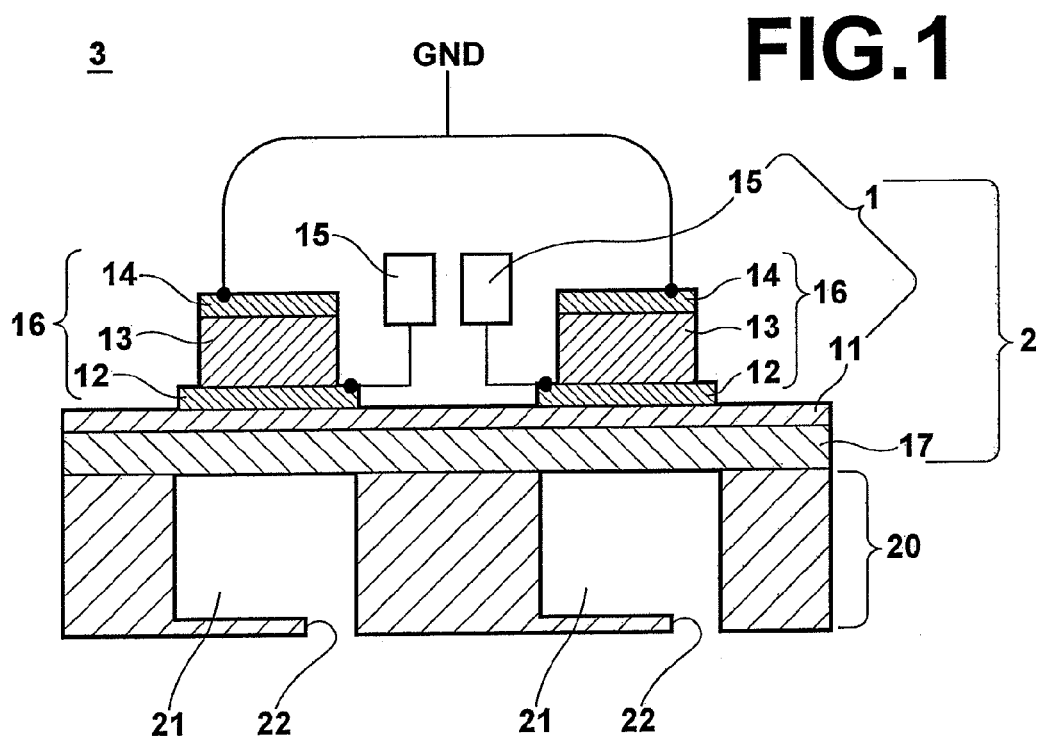
FIG. 1 is a cross-sectional view schematically illustrating a cross section of an essential portion of an inkjet recording head (as a liquid discharge device) having a piezoelectric device according to an embodiment of the present invention.

Hereinbelow, the structure of an inkjet recording head (as an embodiment of the liquid discharge device according to the third aspect of the present invention) containing a piezoelectric device (as an embodiment of the piezoelectric device according to the first aspect of the present invention) is explained with reference to FIG. 1, which is a cross-sectional view schematically illustrating a cross section of an essential portion of the inkjet recording head. In FIG. 1, the dimensions of the illustrated elements are differentiated from the dimensions of the elements of the actual inkjet recording head for clarification.

In outline, the inkjet recording head 3 illustrated in FIG. 1 is constituted by a piezoelectric actuator 2 and an ink-nozzle member 20, and the piezoelectric actuator 2 is constituted by a piezoelectric device 1 and a diaphragm 17.

The piezoelectric device 1 is constituted by a substrate 11 and a laminated film 16 formed on the substrate 11. The laminated film 16 is produced by forming on the substrate 11 a lower electrode layer 12, a piezoelectric layer 13, and an upper electrode layer 14 in this order so that an electric field in the thickness direction can be applied to each portion (corresponding to a pixel or an ink chamber) of the piezoelectric layer 13 through the lower electrode layer 12 and the upper electrode layer 14.

The piezoelectric actuator 2 is produced by attaching the diaphragm 17 to the back surface of the substrate 11 of the piezoelectric device 1 so that the diaphragm 17 can vibrate in correspondence with expansion and contraction of the piezoelectric layer 13.

The inkjet recording head 3 is produced by attaching the ink-nozzle member 20 to the back surface of the piezoelectric actuator 2. The ink-nozzle member 20 is a member for reserving and discharging ink, and comprises ink chambers 21 (as the liquid-reserve chambers) and ink outlets 22 (as the liquid-discharge outlets). Each of the ink chambers 21 is connected to the corresponding one of the ink chambers 21. Each of the ink chambers 21 reserves the ink, and the ink held in the ink chamber is discharged out of the ink chamber through the corresponding ink outlet.

Alternatively, it is possible to process portions of the substrate 11 into the diaphragm 17 and the ink-nozzle member 20, instead of separately preparing the diaphragm 17 and the ink-nozzle member 20 and attaching the diaphragm 17 and the ink-nozzle member 20 to the piezoelectric device 1. For example, the ink chambers 21 can be formed by etching the corresponding portions of the substrate 11 from the bottom surface of the substrate 11, and the diaphragm 17 and the structures of the ink-nozzle member 20 can be produced by processing the substrate 11 per se.

In the above inkjet recording head 3, the strength of the electric field applied to each portion (corresponding to a pixel or an ink chamber) of the piezoelectric device 1 is increased or decreased so as to expand or contract each portion of the piezoelectric device 1 and control the discharge of the ink from the corresponding one of the ink chambers 21 and the discharge amount of the ink.

In the piezoelectric device 1 according to the present embodiment, the spontaneous polarization of the piezoelectric layer 13 is oriented upward. That is, the negatively-polarized side of the spontaneous polarization of the piezoelectric layer 13 is oriented toward the lower electrode layer 12, and the positively-polarized side of the spontaneous polarization of the piezoelectric layer 13 is oriented toward the upper electrode layer 14. In addition, the upper electrode layer 14 realizes a grand (GND) electrode to which a fixed voltage is applied, the lower electrode layer 12 is separated into address electrodes, and variable voltages are applied to the address electrodes. The piezoelectric actuator 2 operates in a deflection vibration mode, and the lower electrode layer 12 and the piezoelectric layer 13 are patterned so that the driving voltage applied to an address electrode corresponding to each ink chamber 21 can be independently varied. Further, the piezoelectric device 1 is provided with drivers 15 which drive the piezoelectric device 1 by varying the voltages applied to the address electrodes constituting the lower electrode layer 12.

The material for the substrate 11 is not specifically limited. For example, the substrate 11 may be made of silicon, glass, stainless steel, YSZ (yttrium stabilized zirconia), $SrTiO_3$, alumina, sapphire, silicon carbide, or the like. In addition, the substrate 11 may be realized by a laminated substrate such as the SOI (silicon-on-insulator) substrate, which is produced by alternately forming on a surface of a silicon substrate one or more oxide films of $SiO_2$ and one or more Si active layers. Further, it is possible to arrange a buffer layer, an adhesion layer, and the like between the substrate 11 and the lower electrode 12. The buffer layer is provided for realizing satisfactory lattice matching between the substrate 11 and the lower electrode layer 12, and the adhesion layer is provided for realizing satisfactory adhesiveness between the substrate 11 and the lower electrode layer 12.

The lower electrode layer 12 is a metal electrode layer containing as one or more main components one or more nonnoble metals and/or one or more nonnoble alloys. Specifically, the lower electrode layer 12 contains as one or more main components one or more of metals Cr, W, Ti, Al, Fe, Mo, In, Sn, Ni, Cu, Co, and Ta, and alloys of these metals. In this case, the etching performance of the lower electrode layer is satisfactory, so that the lower electrode layer 12 can be easily patterned by wet etching. In particular, it is preferable that the lower electrode layer 12 contain as one or more main components one or more of iron (Fe) and alloys of iron. For example, a main component of the lower electrode layer 12 may be a stainless steel.

The main component of the upper electrode layer 14 is not specifically limited, and may be, for example, one or a combination of metals such as Au, Pt, and Ir, metal oxides such as $IrO_2$, $RuO_2$, $LaNiO_3$, and $SrRuO_3$, and the same materials as the above examples of the main component of the lower electrode 12. Further, the thicknesses of the lower and upper electrode layers 12 and 14 are not specifically limited, and are preferably 50 to 500 nm.

The material for the piezoelectric layer 13 is not specifically limited. For example, it is preferable that the piezoelectric layer 13 be basically formed of one or more perovskite oxides, although the piezoelectric layer 13 may contain inevitable impurities. It is further preferable that the piezoelectric layer 13 be basically formed of one or more perovskite oxides having the composition expressed by the compositional formula, $$A_a B_b O_3 \tag{P}$$

where A represents one or more A-site elements, B represents one or more B-site elements, and O represents oxygen atoms. The one or more A-site elements are one or more elements including lead (Pb), and the one or more B-site elements are one or more of the lanthanide series of elements and the elements of Ti, Zr, V, Mb, Ta, Cr, Mo, W, Mn, Sc, Co, Cu, In, Sn, Ga, Zn, Cd, Fe, and Ni. Although normally a=1.0 and b=1.0, the value of each of a and b may deviate from 1.0 within a range in which the composition expressed by the compositional formula $A_a B_b O_3$ can form a perovskite structure. Specifically, the one or more perovskite oxides for the piezoelectric layer 13 may be:

(1) lead compounds such as lead titanate, lead titanate zirconate (PZT), lead zirconate, lead lanthanum titanate, lead lanthanum titanate zirconate, zirconium magnesium niobate-lead titanate, zirconium nickel niobate-lead titanate, and the like;

(2) nonlead compounds such as barium titanate, bismuth sodium titanate, bismuth potassium titanate, sodium niobate, potassium niobate, lithium niobate, and the like; and (3) one or more mixed crystals of the perovskite oxides having the composition expressed by the compositional formula (P).

Furthermore, it is preferable that the piezoelectric layer 13 be basically formed of one or a mixed crystal of PZT and the B-site substituted PZTs having the composition expressed by the compositional formula, $$Pb_a(Zr_{b1}Ti_{b2}X_{b3})O_3, \tag{P-1}$$

where X represents one or more of the Group V and Group VI metal elements, a>0, b1>0, b2>0, and b3≥0. Although normally a=1.0 and b1+b2+b3=1.0, the value of each of a and b1+b2+b3 may deviate from 1.0 within a range in which the composition expressed by the compositional formula $Pb_a(Zr_{b1}Ti_{b2}X_{b3})O_3$ can form a perovskite structure.

2. PROCESS FOR PRODUCING PIEZOELECTRIC DEVICE

Hereinbelow, an example of a process for producing the piezoelectric device 1 is explained.

In the first step, the substrate 11 is prepared, and the lower electrode layer 12 is formed on the substrate 11. It is possible to form a buffer layer and/or an adhesion layer before the formation of the lower electrode layer 12, when necessary.

After the formation of the lower electrode layer 12, the piezoelectric layer 13 is formed on the lower electrode layer 12 in the second step, and then the piezoelectric layer 13 and the lower electrode layer 12 are patterned in the third step so that a portion of the piezoelectric device 1 corresponding to each of the ink chambers 21 can be independently actuated. Thereafter, the upper electrode layer 14 is formed over the patterned piezoelectric layer 13 in the fourth step, and the controllers 15 and necessary wirings are formed in the fifth step. Thus, production of the piezoelectric device 1 is completed.

The techniques used for formation of the lower electrode layer 12, the piezoelectric layer 13, and the upper electrode layer 14 are not specifically limited. For example, the techniques may be vapor phase epitaxy using plasma such as sputtering, ion beam sputtering, ion plating, plasma CVD (chemical vapor deposition), and the like.

The piezoelectric layer 13 is effectively expanded and contracted in response to increase and decrease in the strength of the electric field applied to the piezoelectric layer 13 when the direction of the electric field coincides with the orientation of a vector component of the spontaneous polarization axis in the piezoelectric layer 13. Therefore, it is preferable to use as the piezoelectric layer 13 an oriented film in which variations in the orientation of the spontaneous polarization axis are small.

The crystal structure of the piezoelectric layer 13 is not specifically limited. In the case where the PZT-based materials are used, the crystal structure of the piezoelectric layer 13 may be a tetragonal structure, a rhombohedral structure, or a mixture of the tetragonal and rhombohedral structures. For example, in the case where the piezoelectric layer 13 is formed of $Pb_{1.3}Zr_{0.52}Ti_{0.48}O_3$, the crystal structure of the piezoelectric layer 13 can be a monocrystal tetragonal structure, a mixture of the tetragonal and rhombohedral structures, or a monocrystal rhombohedral structure according to the film formation condition.

As mentioned before, according to the present invention, the spontaneous polarization is oriented upward. That is, the negatively-polarized side of the spontaneous polarization of the piezoelectric layer 13 is oriented toward the lower electrode layer 12, and the positively-polarized side of the spontaneous polarization of the piezoelectric layer 13 is oriented toward the upper electrode layer 14. Since the polarization-inversion processing of a PZT-based piezoelectric layer may not be able to realize sufficient piezoelectric performance of the PZT-based piezoelectric layer, it is preferable that the PZT-based piezoelectric layer have upward spontaneous polarization immediately after formation of the PZT-based piezoelectric layer even when no special polarization processing is performed.

For example, in the case where the piezoelectric layer 13 contains a rhombohedral phase (i.e., in the case where the piezoelectric layer 13 is formed of a rhombohedral structure or a mixture of tetragonal and rhombohedral structures), it is preferable that the piezoelectric layer 13 be (100) oriented. Since the spontaneous polarization of the rhombohedral crystal is oriented along the <111> direction, the spontaneous polarization has a vector component in the upward direction when the piezoelectric layer 13 is (100) oriented.

As mentioned in the "Description of the Related Art," conventionally, the patterning of the lower electrode layer is difficult. Therefore, conventionally, the PZT-based piezoelectric layer and the upper electrode layer are patterned into separate pieces corresponding to a plurality of ink chambers, the lower electrode layer is used as the grand electrode, and the separate pieces of the upper electrode layer are used as address electrodes to be driven. Further, conventionally, polarization-inversion processing is performed so as to make the spontaneous polarization of the PZT-based piezoelectric layer oriented downward, and the upper electrode layer is driven by positive-output drivers.

On the other hand, according to the present embodiment, the lower electrode layer 12 is a metal electrode layer containing as one or more main components one or more nonnoble metals and/or one or more nonnoble alloys. Such a metal electrode layer exhibits satisfactory etching performance, and can be easily patterned by the wet etching, which is less expensive than the dry etching. For example, in the case where the main component of the lower electrode layer 12 is stainless steel as iron alloy, the piezoelectric layer 13 can be easily patterned by wet etching using, for example, a 1:1:3 mixture of 37 weight percent hydrochloric acid, 70 weight percent nitric acid, and water. Therefore, the lower electrode layer 12 can be patterned into desired pieces so as to produce the address electrodes. Thus, according to the present embodiment, it is possible to process the lower electrode layer 12 into the address electrodes without performing the polarization-inversion processing, and produce the piezoelectric device 1, in which the address electrodes constituting the lower electrode layer can be driven by positive-output drivers.

As explained above, it is preferable that the lower electrode layer 12 and the piezoelectric layer 13 be patterned by wet etching. The patterning of the lower electrode layer 12 and the piezoelectric layer 13 may be performed either concurrently or separately. However, it is preferable that the lower electrode layer 12 and the piezoelectric layer 13 be concurrently patterned from the viewpoint of reduction of the number of process steps.

In the case where the piezoelectric layer 13 is formed by vapor phase epitaxy such as sputtering, the film-formation temperature is preferably 400° C. to 600° C. It is difficult to stably grow perovskite crystals below 400° C. In the case where the piezoelectric layer 13 of a lead-containing material such as a PZT-based material is formed, lead is likely to be lost when the film-formation temperature is above 600° C. In addition, in the case where the piezoelectric layer 13 is formed above 600° C., regardlessly of inclusion or noninclusion of lead, the difference in the thermal expansion coefficient between the substrate 11 and the piezoelectric layer 13 imposes stress on the piezoelectric layer 13, for example, during the operation of forming the film or during the operation of cooling the piezoelectric layer 13 after the film formation, so that cracks and the like are likely to occur in the piezoelectric layer 13.

The present inventors have found that a preferable condition for forming the piezoelectric layer 13 by vapor phase epitaxy using plasma such as sputtering is that the difference Vs–Vf between the floating potential Vf and the plasma potential Vs in plasma generated during formation of the piezoelectric layer should be 10 to 35 V.

In this specification, it is assumed that the plasma potential Vs and the floating potential Vf are measured by the single-probe technique using the Langmuir probe. In order to prevent inclusion of errors caused by adhesion of a portion of a film being formed or the like to the probe, the tip of the probe is maintained in the vicinity of the substrate (for example, approximately 10 mm above the substrate) in the measurement, and the measurement is completed in the shortest possible time. The potential difference Vs–Vf between the plasma potential Vs and the floating potential Vf, measured in volts (V), can be directly converted into an electron temperature expressed in electron volts (eV), where 1 eV corresponds to 11,600 K (Kelvin).

Figure 2:
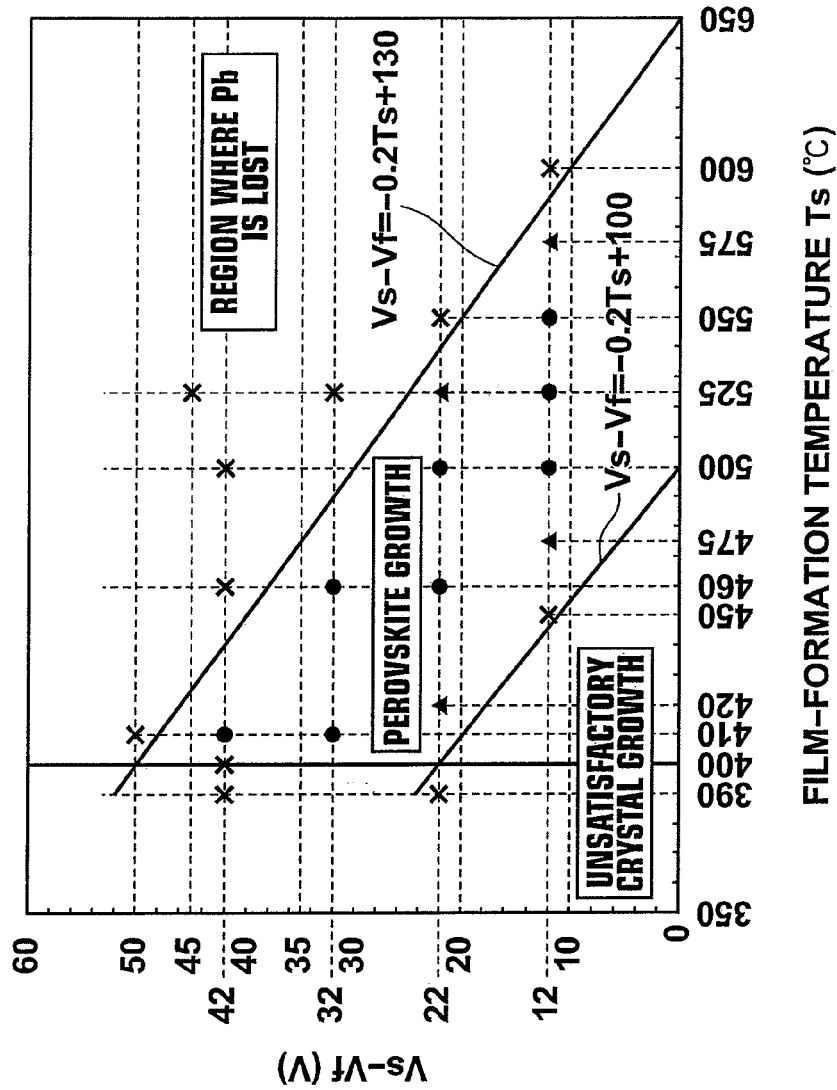
FIG. 2 is a diagram indicating results of XRD measurement of PZT films and Nb-PZT films which are formed by vapor phase epitaxy using plasma, where the abscissa corresponds to the film-formation temperature Ts, and the ordinate corresponds to Vs–Vf.

The present inventors have produced samples of the piezoelectric layer by sputtering using targets of PZT ($Pb_{1.3}Zr_{0.52}Ti_{0.48}O_3$) or Nb-PZT ($Pb_{1.3}Zr_{0.43}Ti_{0.44}Nb_{0.13}O_3$) at different film-formation temperatures Ts with different potential differences Vs–Vf, and evaluated the structures of the samples by performing XRD (X-ray diffraction) measurement. The results of the evaluation are indicated in FIG. 2. In FIG. 2, the abscissa corresponds to the film-formation temperature Ts, and the ordinate corresponds to the potential difference Vs–Vf. The marks at a plurality of points in FIG. 2 indicate the evaluation results of the samples formed at the respective temperatures Ts with the respective potential differences Vs–Vf. The filled circles indicate that the samples are evaluated as having a satisfactory structure, the filled triangles indicate that the samples are evaluated as having a structure which has a problem but is acceptable, and the crosses indicate that the samples are evaluated as having an unsatisfactory structure. Further, in FIG. 2, the samples formed at the film-formation temperature Ts of 525° C. are Nb-PZT films, and the samples formed at the other temperatures are PZT films.

For example, among the samples formed under the condition that the potential difference Vs–Vf is approximately 12, the XRD result of the sample formed at the film-formation temperature Ts of 450° C. indicates that the sample formed at 450° C. is mainly constituted by a pyrochlore phase, so that the sample formed at 450° C. is evaluated as being unsatisfactory. The XRD result of the sample formed at the film-formation temperature Ts of 475° C. indicates that a pyrochlore phase begins to appear in the sample formed at 475° C., so that the sample formed at 475° C. is evaluated as having a problem but being acceptable. The XRD results of the samples formed in the range of 500° C. to 550° C. indicate that perovskite crystals having satisfactory crystal orientation are stably obtained in the samples formed in the range of 500° C. to 550° C., so that the samples formed in the range of 500° C. to 550° C. are evaluated as being satisfactory. The XRD results of the sample formed at the film-formation temperatures of 575° C. and 600° C. indicate that the crystal orientation begins to break in the sample formed at 575° C. Therefore, the sample formed at 575° C. is evaluated as having a problem but being acceptable, and the sample formed at 600° C. is evaluated as being unsatisfactory.

Consequently, as indicated in FIG. 2, in the case where the films of PZT or Nb-PZT are formed under the condition that the film-formation temperature Ts (° C.) and the difference between the floating potential Vf (V) and a plasma potential Vs (V) in plasma generated during film formation satisfy the inequalities, $400 \leq Ts \leq 600$, $-0.2Ts+100 < Vs-Vf \leq -0.2Ts+130$, and $10 \leq Vs-Vf \leq 35$, it is possible to stably grow perovskite crystals containing the pyrochlore phase only in very small portions, and stably suppress lead loss (Pb defect). Therefore, according to the present embodiment, it is possible to stably form a high-quality piezoelectric layer having satisfactory crystal structure and composition.

As explained above, in the piezoelectric device 1 according to the present embodiment, the lower electrode layer 12, the piezoelectric layer 13, and the upper electrode layer 14 are formed in this order on the substrate 11, and the lower electrode layer 12 is a metal electrode layer containing as one or more main components one or more nonnoble metals and/or one or more nonnoble alloys. Since such a metal electrode layer exhibits satisfactory etching performance, and can be easily patterned by wet etching, which is less expensive than dry etching, the lower electrode layer 12 can be patterned into the address electrodes. Therefore, it is unnecessary to perform the polarization-inversion processing even although the negatively-polarized side of the spontaneous polarization of the piezoelectric layer 13 is oriented toward the lower electrode layer 12. Consequently, according to the present invention, it is possible to produce, at low cost, the piezoelectric device 1 exhibiting satisfactory piezoelectric performance.

3. INKJET RECORDING APPARATUS

Figure 3:
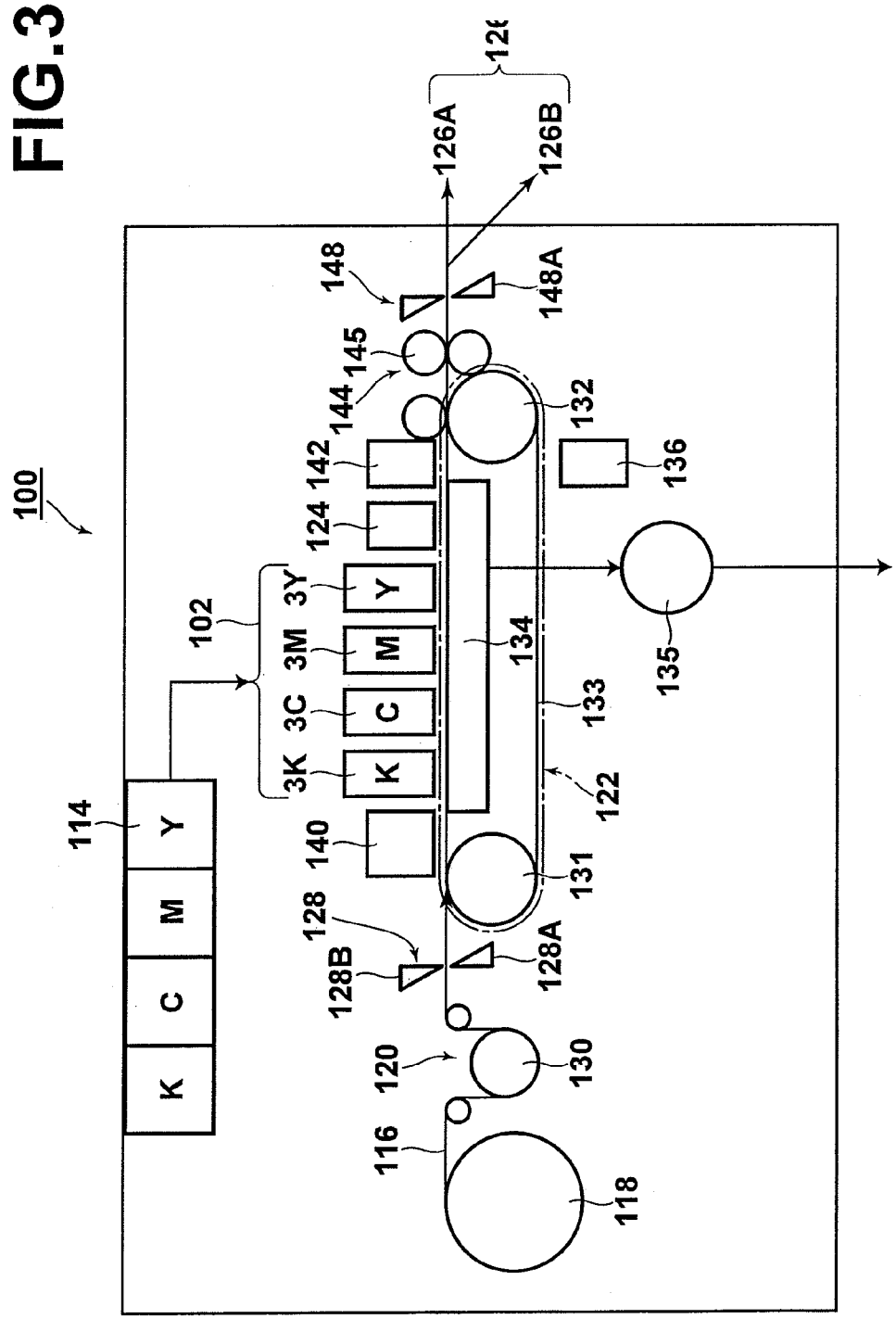
FIG. 3 is a schematic diagram of an example of an inkjet recording apparatus using the inkjet recording head of FIG. 1.
Figure 4:
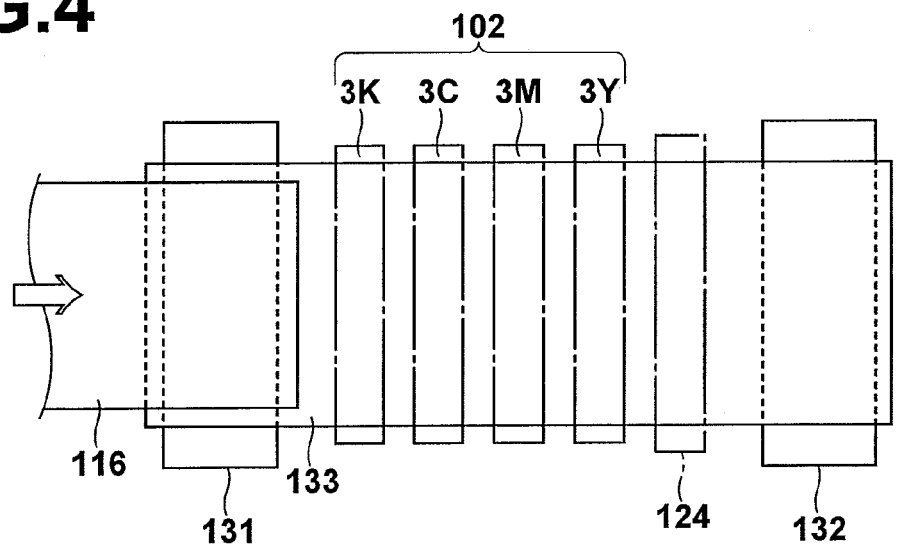
FIG. 4 is a top view of a portion of the inkjet recording apparatus of FIG. 3.

Hereinbelow, an example of an inkjet recording apparatus having the inkjet recording head 3 is explained with reference to FIGS. 3 and 4. FIG. 3 is a schematic diagram illustrating an outline of an example of an inkjet recording apparatus having the inkjet recording head 3 of FIG. 1, and FIG. 4 is a top view of a portion of the inkjet recording apparatus of FIG. 3.

As schematically illustrated in FIG. 3, the inkjet recording apparatus 100 comprises a printing unit 102, an ink reserve-and-load unit 114, a sheet feeding unit 118, a decurling unit 120, a suction-type belt conveyer 122, a print detection unit 124, and a sheet output unit 126. The printing unit 102 comprises a plurality of inkjet recording heads 3K, 3C, 3M, and 3Y corresponding to inks of different colors (specifically, black (K), cyan (C), magenta (M), and yellow (Y)). Hereinafter, the inkjet recording heads may be referred to as heads. The ink reserve-and-load unit 114 reserves the inks to be supplied to the heads 3K, 3C, 3M, and 3Y. The sheet feeding unit 118 feeds a recording sheet 116. The decurling unit 120 eliminates curl of the recording sheet 116. The suction-type belt conveyer 122 is arranged to face the nozzle faces (ink-discharge faces) of the printing unit 102, and conveys the recording sheet 116 while maintaining the flatness of the recording sheet 116. The print detection unit 124 reads an image printed on the recording sheet 116 by the printing unit 102. The sheet output unit 126 externally outputs a printed recording sheet 116.

Each of the heads 3K, 3C, 3M, and 3Y constituting the printing unit 102 corresponds to the inkjet recording head according to the present embodiment as explained before. In order to realize a linear head (explained later), each inkjet recording head used in the inkjet recording apparatus 100 comprises a plurality of ink chambers and a plurality of ink-discharge outlets.

The decurling unit 120 performs decurling of the recording sheet 116 by heating the recording sheet 116 with a heating drum 130 so as to eliminate the curl produced in the sheet feeding unit 118.

In the case where the inkjet recording apparatus 100 uses roll paper, a cutter 128 for cutting the roll paper into desired size is arranged in the stage following the decurling unit 120 as illustrated in FIG. 3. The cutter 128 is constituted by a fixed blade 128A and a round blade 128B. The fixed blade 128A has a length equal to or greater than the width of the conveying path of the recording sheet 116, and is arranged on the side opposite to the print side of the recording sheet 116. The round blade 128B is arranged opposite to the fixed blade 128A on the print side of the recording sheet 116, and moves along the fixed blade 128A. In the inkjet recording apparatuses using cut paper, the cutter 128 is unnecessary.

After the roll paper is decurled and cut into the recording sheet 116, the recording sheet 116 is transferred to the suction-type belt conveyer 122. The suction-type belt conveyer 122 is constituted by rollers 131 and 132 and an endless belt 133. The rollers 131 and 132 are placed apart and the endless belt 133 is looped around the rollers 131 and 132 in such a manner that at least portions of the endless belt 133 which face the nozzle faces of the printing unit 102 and the sensor face of the print detection unit 124 are flat and horizontal.

The endless belt 133 has a width greater than the width of the recording sheet 116, and a great number of suction pores (not shown) are formed through the endless belt 133. A suction chamber 134 is arranged inside the loop of the endless belt 133 at the position opposite to the nozzle faces of the printing unit 102 and the sensor face of the print detection unit 124, and suctioned by a fan 135, so that a negative pressure is generated in the suction chamber 134, and the recording sheet 116 on the endless belt 133 is held by suction.

The power of a motor (not shown) is transmitted to at least one of the rollers 131 and 132 so that the endless belt 133 is driven clockwise in FIG. 3, and the recording sheet 116 held on the endless belt 133 is moved from left to right in FIG. 3.

In the case of borderless printing, ink can be deposited on the endless belt 133. Therefore, in order to clean the endless belt 133, a belt cleaning unit 136 is arranged at a predetermined (appropriate) position outside the loop of the endless belt 133 and the printing region.

A heating fan 140 is arranged on the upstream side of the printing unit 102 above the conveying path of the recording sheet 116 (which is realized by the suction-type belt conveyer 122). The heating fan 140 blows heated air to the recording sheet 116 before printing so as to heat the recording sheet 116 and facilitate drying of deposited ink.

Each of the heads 3K, 3C, 3M, and 3Y in the printing unit 102 is a so-called full-line type head, which is a linear head having a length corresponding to the maximum width of the recording sheet 116, and being arranged across the width of the recording sheet 116 (i.e., in the main scanning direction perpendicular to the feeding direction of the recording sheet 116) as illustrated in FIG. 4. Specifically, each of the heads 3K, 3C, 3M, and 3Y is a linear head in which the aforementioned plurality of ink-discharge outlets (nozzles) are arrayed over a length exceeding the maximum length of a side of the largest recording sheet 116 on which the inkjet recording apparatus 100 can print an image. The heads 3K, 3C, 3M, and 3Y corresponding to the inks of the different colors are arrayed upstream in this order along the feeding direction as illustrated in FIG. 4. Thus, a color image can be printed on the recording sheet 116 by discharging the inks of the different colors while conveying the recording sheet 116.

The print detection unit 124 may be constituted by, for example, a line sensor which takes an image formed of spots of the inks discharged from the printing unit 102, and detects, from the image taken by the line sensor, incomplete discharge, which can be caused by clogging of a nozzle or the like.

A rear drying unit 142 for drying the printed surface of the recording sheet 116 is arranged in the stage following the print detection unit 124. For example, the rear drying unit 142 is realized by a heating fan or the like. Since it is preferable to avoid contact with the printed surface before the ink on the printed surface is completely dried, it is preferable that the rear drying unit 142 dry the ink on the printed surface by blowing heated air.

In order to control the glossiness of the image printed on the recording sheet 116, a heating-and-pressurizing unit 144 is arranged in the stage following the rear drying unit 142. The heating-and-pressing unit 144 comprises a pressure roller 145 having a surface having predetermined projections and depressions, and transfers the predetermined projections and depressions to the printed surface of the recording sheet 116 by pressing the printed surface with the pressure roller 145 while heating the printed surface.

Finally, the printed recording sheet 116 produced as above is outputted from the sheet output unit 126. It is preferable to separately output test prints and prints for practical use. Therefore, the sheet output unit 126 includes a first output unit 126A for the prints for practical use and a second output unit 126B for the test prints. Although not shown, the inkjet recording apparatus 100 further comprises a sorting unit which sorts the printed recording sheets 116 into the test prints and the prints for practical use, and sends the test prints to the first output unit 126B, and the prints for practical use to the second output unit 126A.

Further, in the case where both of a test image and an image for practical use are concurrently printed on a recording sheet 116, it is possible to arrange a cutter 148, and separate a first portion of the recording sheet 116 on which the test image is printed and a second portion of the recording sheet 116 on which the image for practical use is printed.

4. CONCRETE EXAMPLES OF THE PRESENT INVENTION

The present inventors have produced a concrete example of an inkjet recording head having a piezoelectric device according to the present invention and a comparison example of an inkjet recording head having a conventional piezoelectric device as indicated below.

4.1 Concrete Example

In the concrete example of the inkjet recording head including a piezoelectric device according to the present invention, a piezoelectric layer of PZT is formed by using a target of $Pb_{1.3}Zr_{0.52}Ti_{0.48}O_3$ in the atmosphere of a mixture of Ar and 1.0 voltage percent of $O_2$ at the pressure of 0.5 Pa.

Before the formation of the PZT piezoelectric layer, a substrate on which a lower electrode layer is formed is prepared. Specifically, an adhesion layer of Ti having a thickness of 10 nm and a lower electrode layer of the type 430 stainless steel (e.g., SUS430 according to Japanese Industrial Standard (JIS)) having a thickness of 200 nm are formed in this order on a SOI ($Si/SiO_2/Si/SiO_2$) substrate.

Thereafter, the piezoelectric layer is formed while the substrate with the lower electrode layer is placed in a floating arrangement and a ground is arranged at a position apart from the substrate. At this time, the plasma potential Vs and the floating potential Vf (i.e., the potential in the vicinity of the substrate (approximately 10 mm above the substrate)) are measured, and the potential difference Vs−Vf of approximately 35 V is obtained. During the formation of the piezoelectric layer, the substrate temperature is 480° C., and the RF (radio frequency) power is 500 W. The thickness of the formed piezoelectric layer is 4 micrometers.

Figure 5:
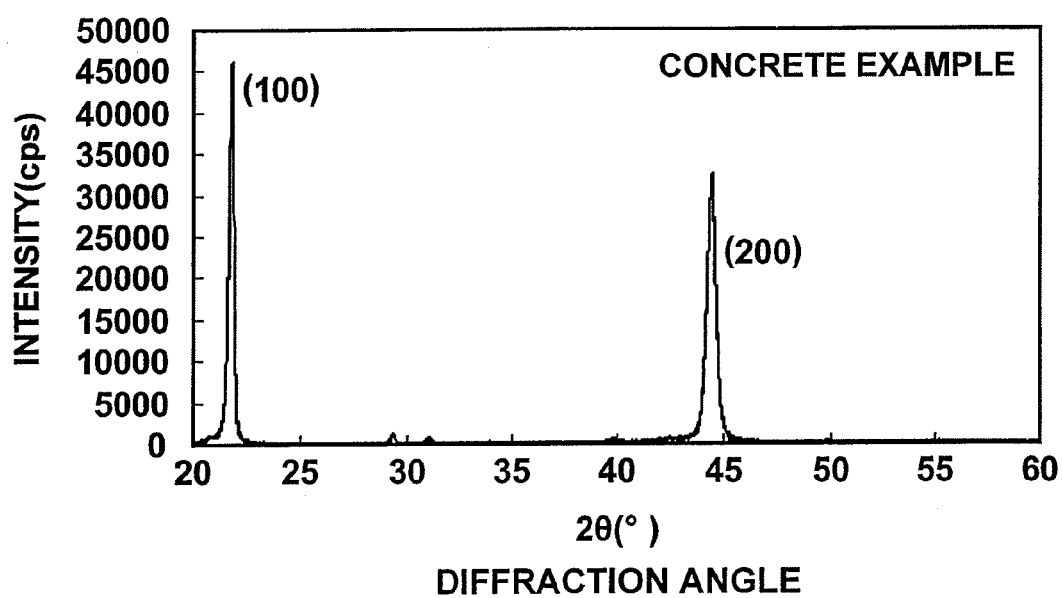
FIG. 5 is an XRD (X-ray diffraction) profile of a piezoelectric film in a concrete example.

FIG. 5 is an XRD (X-ray diffraction) profile of the piezoelectric film in the concrete example. As indicated in FIG. 5, the obtained piezoelectric layer is (100) oriented, and the degree of orientation is 90% or higher.

The present inventors have measured the piezoelectric constant $d_{31}$ of the PZT piezoelectric film by using a cantilever, and obtained the value of the piezoelectric constant $d_{31}$ as 130 pm/V. In addition, the present inventors have confirmed that the negatively-polarized side of the spontaneous polarization of the piezoelectric layer is oriented toward the lower electrode layer, and the positively-polarized side of the spontaneous polarization of the piezoelectric layer is oriented toward the upper electrode layer.

After the piezoelectric film of PZT is formed, the piezoelectric film is masked with photoresist, and then the piezoelectric film of PZT and the lower electrode layer of the type 430 stainless steel are patterned by wet etching. A BHF (buffered hydrogen fluoride) solution (e.g., a 1:6 mixture solution of a 40 weight percent ammonium fluoride solution and fluoric acid) is used as an etchant solution in the etching of the piezoelectric film, and a 1:1:3 mixture of 37 weight percent hydrochloric acid, 70 weight percent nitric acid, and water is used as an etchant solution in the etching of the lower electrode layer.

Then, the upper electrode layer is formed on the patterned piezoelectric film of PZT, and finally, ink nozzles including ink chambers with the dimensions of 500×500 micrometers and accompanying ink-discharge outlets are formed on the back side of the SOI substrate by processing the back surface of the SOI substrate by RIE (reactive ion etching) so that an active layer in the SOI substrate can operate as a diaphragm. Thus, production of the inkjet recording head is completed.

The present inventors have driven the inkjet recording head by using the lower electrode layer as the address electrodes and the upper electrode layer as the grand electrode, and using positive-output drivers for driving the address electrodes. The present inventors have confirmed that the inkjet recording head produced as above operates satisfactorily.

4.2 Comparison Example

Figure 6:
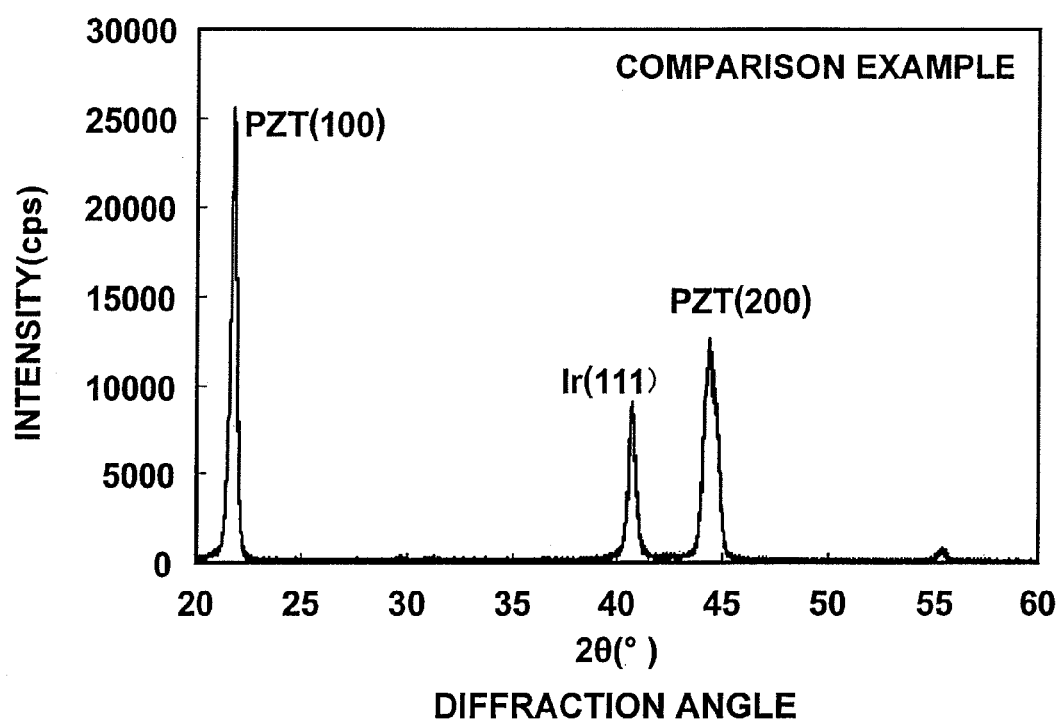
FIG. 6 is an XRD profile of a piezoelectric film in a comparison example.

The comparison example of the inkjet recording head including the conventional piezoelectric device is produced in a similar manner to the above concrete example except that the lower electrode layer is formed of iridium (Ir). FIG. 6 is an XRD profile of the piezoelectric film in the comparison example. As indicated in FIG. 6, the obtained piezoelectric layer in the comparison example is (100) oriented, and the degree of orientation is 90% or higher.

The present inventors have measured the piezoelectric constant $d_{31}$ of the PZT piezoelectric film in the comparison example by using a cantilever, and obtained the value of the piezoelectric constant $d_{31}$ as 130 pm/V. In addition, the present inventors have confirmed that the orientation of the spontaneous polarization in the piezoelectric layer is similar to the concrete example.

After the piezoelectric film of PZT is formed, the piezoelectric film is masked with photoresist, and then the piezoelectric film is patterned by wet etching under a similar condition to the concrete example. However, the lower electrode layer of Ir is difficult to wet etch. In addition, since it is difficult to realize, in dry etching, a desirable ratio between the etching rates of the lower electrode layer of Ir and the Si-based substrate underlying the lower electrode layer, the lower electrode layer of Ir is also difficult to satisfactorily dry etch. Therefore, the lower electrode layer is not patterned, and is uniformly formed.

Subsequently, the upper electrode layer and the ink nozzles are formed in similar manners to the concrete example. Thereafter, in order to drive the upper electrode layer as address electrodes, polarization-inversion processing of the piezoelectric layer is performed at room temperature. Thus, production of the inkjet recording head as the comparison example is completed.

The present inventors have driven the inkjet recording head as the comparison example by using the upper electrode layer as the address electrodes and the lower electrode layer as the grand electrode, and using positive-output drivers for driving the address electrodes. The present inventors have observed that the displacement achieved by the inkjet recording head as the comparison example is as small as approximately one-third of the displacement achieved by the inkjet recording head as the concrete example according to the present invention.

5. ADDITIONAL MATTERS

The piezoelectric devices according to the present invention can be preferably used in piezoelectric actuators, diaphragms, and the like which are mounted in the inkjet recording heads, the magnetic recording-and-reproduction heads, MEMS (micro electromechanical systems) devices, micropumps, ultrasonic probes, and the like.

What is claimed is:

1. A process for producing a piezoelectric device comprising: a substrate; and a laminated film being formed above said substrate, and including, a lower electrode layer, a piezoelectric layer formed by sputtering on said lower electrode layer, and an upper electrode layer formed on said piezoelectric layer; wherein said lower electrode layer is a metal electrode layer containing as one or more main components one or more of nonnoble metals and nonnoble alloys, said process comprising the steps of:
    (a) forming a first film for said lower electrode layer;
    (b) patterning said first film;
    (c) forming a second film for said piezoelectric layer; and
    (d) patterning said second film, wherein
    said lower electrode layer is formed by vapor phase epitaxy,
    said lower electrode layer is patterned by use of wet etching,
    said piezoelectric layer is foamed at 400° C. to 600° C., and
    said piezoelectric layer is formed by vapor phase epitaxy using plasma under a condition that the difference between a floating potential and a plasma potential in plasma generated during formation of the piezoelectric layer is 10 to 35 V.

2. The process for producing a piezoelectric device according to claim 1, wherein said piezoelectric layer is formed under a condition satisfying inequalities, −0.2Ts+100 Vs−Vf−0.2Ts+130, and 10 35, where Ts represents in degrees centigrade a value of film-formation temperature, and Vs−Vf represents in volts a difference between a floating potential and a plasma potential in plasma generated during formation of the piezoelectric layer.

3. The process for producing according to claim 1, wherein said step (b) and said step (d) are concurrently performed after said step (a) and said step (c) are performed.

4. The process for producing according to claim 3, wherein said step (b) and said step (d) are performed by use of wet etching.

5. The process for producing according to claim 1, wherein said lower electrode layer contains as one or more main components one or more of metals Cr, W, Ti, Al, Fe, Mo, In, Sn, Ni, Cu, Co, and Ta, and alloys of the metals.

6. The process for producing according to claim 1, wherein said lower electrode layer contains as one or more main components one or more of iron and alloys of iron.

7. The process for producing according to claim 1, wherein said metal electrode is not an oxide.

* * * * *